United States Patent [19]
Tanigawa

[11] Patent Number: 5,663,085
[45] Date of Patent: Sep. 2, 1997

[54] METHOD FOR FABRICATING CAPACITIVE ELEMENT OF SEMICONDUCTOR MEMORY DEVICE

[75] Inventor: Takaho Tanigawa, Tokyo, Japan

[73] Assignee: NEC Corporation, Japan

[21] Appl. No.: 637,036

[22] Filed: Apr. 24, 1996

[30] Foreign Application Priority Data

Apr. 27, 1995 [JP] Japan ................................ 7-103748

[51] Int. Cl.⁶ ................................................ H01L 21/8242
[52] U.S. Cl. ........................... 438/255; 438/398; 438/964
[58] Field of Search .............................. 437/47, 52, 60, 437/919, 977; 148/DIG. 14, DIG. 138

[56] References Cited

U.S. PATENT DOCUMENTS 5,486,488  1/1996  Kamiyama ................................ 437/60

FOREIGN PATENT DOCUMENTS 5-67730  3/1993  Japan.

Primary Examiner—Tuan H. Nguyen

[57] ABSTRACT

After formation of a node-contact hole through an interlayer insulation film, an LPCVD using a monosilane gas is employed to form a non-doped polycrystalline silicon film on the interlayer insulation film, filling the node-contact hole. The non-doped polycrystalline silicon film is converted into an n-type polycrystalline silicon film. Using a disilane gas and a phosphine gas as raw gases, an n-type doped amorphous silicon film is formed. After patterning, a heat treatment is employed under a super-high vacuum pressure to convert the n-type doped amorphous silicon film into an n-type polycrystalline silicon film with a rugged surface. A capacitive element is fabricated with a reduced dispersion of capacitance in a simplified manner suitable for a miniaturization of cell size.

3 Claims, 7 Drawing Sheets

METHOD FOR FABRICATING CAPACITIVE ELEMENT OF SEMICONDUCTOR MEMORY DEVICE

BACKGROUND OF THE INVENTION

The present invention relates to a method for fabricating a capacitive element of a semiconductor memory device, and particularly, to a method for fabricating a capacitive element of a stacked type that has a storagenode electrode with a rugged surface to constitute a memory cell of a dynamic random access memory (hereafter "DRAM").

DESCRIPTION OF THE RELATED ART

In the DRAM composed of memory cells each having a capacitive element of a stacked type, there have been applied a variety of three-dimensional measures to an adequate member of the capacitive element, such as a storagenode electrode, for reducing an area occupied by each memory cell to increase an area of an opposite electrode of the capacitive element.

For example, the Japanese Patent Application Laid-Open Publication No. 5-67730 (hereafter "JPA 5-67730") has disclosed a semiconductor device in which a storagenode electrode has a rugged surface with semispherical concaves and convexes.

FIGS. 1A to 1F and 2A to 2B illustrate a series of schematic sections of a capacitive element of a DRAM, as it is fabricated by steps disclosed in the JPA 5-67730.

At a first step illustrated by FIG. 1A, a p-type silicon substrate 201 has in a device isolating surface region thereof a field oxide film 202 of a LOCOS type formed as a field insulation film, and in a device building surface region thereof a gate oxide film 203 formed as a gate insulation film by a thermal oxidation.

A gate electrode 204, which forms part of a wordline (204), is deposited on the gate oxide film 203.

A pair of n-type diffusion regions 205 and 206 that will constitute source and drain regions, respectively, are formed in the device building surface region of the p-type silicon substrate 201 by an ion injection of arsenic or the like, so that they self-align to the field oxide film 202 and the gate electrode 204.

As an interlayer insulation film 207, an oxidized silicon film is deposited over an entire surface region.

Then using a photoresist film 208 as a mask, a node-contact hole 209 is formed by an anisotropic etching, to a depth reaching one of the n-type diffusion regions (source and drain regions).

At a second step illustrated by FIG. 1B, as the photoresist film 208 is removed, a non-doped polycrystalline silicon film is deposited by a (first) low pressure chemical-vapor deposition (hereafter "LPCVD") using monosilane ($SiH_4$) gas as a raw gas at approx. 600° C. The non-doped polycrystalline silicon film has a larger thickness than half an aperture diameter of the node-contact hole 209, so that it fills out the hole 209.

Then, the non-doped polycrystalline silicon film is converted into a (first) n-type polycrystalline silicon film 213 by an ion injection of arsenic or phosphorus or by a thermal diffusion of phosphorus.

At a third step illustrated by FIG. 1C, a (first) non-doped amorphous silicon film 214a is deposited by a (second) LPCVD using a monosilane gas as a raw gas at approx. 510° C.

On the non-doped amorphous silicon film 214a is formed a photoresist film 228, which is patterned to cover a surface region defined by an inwardly displaced periphery at a distance of approx. 200 nm from a periphery of a prearranged region for a storagenode electrode.

At a fourth step illustrated by FIG. 1D, using the patterned photoresist film 228 as a mask, a non-masked peripheral region of the non-doped amorphous silicon film 214a and a corresponding region of the n-type polycrystalline silicon film 213 are etched off in this order by an anisotropical etching, leaving a masked portion 214a of the non-doped amorphous silicon film 214a and a corresponding portion 213a of the n-type polycrystalline silicon film 213, as they are.

Then, a (second) non-doped amorphous silicon film 214b of an approx. 200-nm thickness is formed over an entire surface by a (third) LPCVD using a monosilane gas as a raw gas at approx. 510° C.

At a fifth step illustrated by FIG. 1E, the non-doped amorphous silicon film 214b is vertically etched back until the interlayer insulation film 207 as well as the remaining portion 214aa of the non-doped amorphous silicon film 214a has an exposed surface, so that a head part of the remaining portion 213a of the n-type polycrystalline silicon film 213 is totally covered along a lateral side thereof with a remaining portion 214ba of the non-doped amorphous silicon film 214b and at a top face thereof with the remaining portion 214aa of the non-doped amorphous silicon film 214a.

At a sixth step illustrated by FIG. 1F, the remaining portions 214aa and 214ba of the non-doped amorphous silicon films have their surface regions washed by a mixed system of solutions of ammonia ($NH_4OH$) and hydrogen peroxide ($H_2O_2$).

Natural oxidation scales on the washed surface regions are removed by using hydrofluoric acid (HF).

Then, by a heat treatment of about one hour under a super-high vacuum pressure of approx. $1.3 \times 10^{-7}$ Pa at approx. 600° C., the remaining non-doped amorphous silicon film portions 214aa and 214ba are crystallized from their surfaces to obtain corresponding non-doped polycrystaline silicon films 215a and 215b having rugged surfaces with semispherical grains.

At a seventh step illustrated by FIG. 2A, by a heat treatment at approx. 800° C., an n-type dopant is thermally diffused from the n-type polycrystalline silicon film 213a into the non-doped polycrystalline silicon films 215a and 215b, so that these films 215a and 215b are converted into (second and third) n-type polycrystalline silicon films 216a and 216b, respectively.

As a result, there is formed a storagenode electrode 217 composed of the (first to third) n-type polycrystalline silicon films 216a, 216b and 213a.

At an eighth step illustrated by FIG. 2B, a capacitive insulation film 218 and a cell plate electrode 219 are formed in this order to complete the fabrication of the capacitive element.

According to the conventional fabrication method disclosed by the JPA 5-67730, a combination of the n-type polycrystalline silicon films 216a and 216b of FIG. 2A (or of the non-doped polycrystalline silicon films 215a and 215b of FIG. 1F) has an about twice as large total area as that of the non-doped amorphous silicon films 214aa and 214ba of FIG. 1E.

Therefore, an opposite electrode 216a, 216b of a capacitive element 217 of a memory cell is permitted to have an increased surface area without increasing an occupied area by the memory cell.

However, the conventional fabrication method disclosed by the JPA 5-67730 needs elaborate process steps for fabricating the capacitive element 217, e.g. a total of three steps each requiring an LPCVD of a silicon film in addition to a step of etching back a silicon film.

Moreover, the conventional fabrication method needs thermally diffusing an n-type dopant from the n-type polycrystalline silicon film 213a into the (first and second) non-doped amorphous silicon films 214aa and 214ba to be converted into an n-type, which step however is disadvantageous to a miniaturization of the memory cell.

For example, in the case of a 0.35 μm design rule, the n-type diffusion regions 205 and 206 are required to have a dopant concentration of an order of $10^{19}$ cm$^{-3}$ to prevent a punch-through therebetween.

In this respect, the n-type polycrystalline silicon film 213a filling the node contact hole 209 should have a dopant concentration low enough to avoid providing the n-type diffusion region 205 with an undue amount of n-type dopant, when heated for the thermal diffusion to convert the non-doped amorphous silicon films 214aa and 214ba into the n-type.

Therefore, the dopant concentration of the n-type polycrystalline silicon film 213a needs to be controlled to an order of $10^{20}$ cm$^{-3}$, while an order of $10^{21}$ cm$^{-3}$ is necessary for a sufficient thermal diffusion to convert the non-doped amorphous silicon films 214aa and 214ba into the n-type.

As a result, with an insufficient conversion into the n-type, a depletion layer of the storage node electrode 216a, 216b tends to expand so that the capacitive element 217 has a decreased capacitance in effective value inconsistent with the the inherent object to form the electrode 216a, 216b with rugged surfaces.

Further, the conventional fabrication method in which a silicon film is etched back tends to have an increased dispersion in capacitance of capacitive elements.

The present invention has been achieved with such points in mind.

SUMMARY OF THE INVENTION

It therefore is an object of the present invention to provide a method for fabricating a capacitive element of a semiconductor memory device with a decreased dispersion of capacitance, in a simplified manner adaptive to a miniaturization of a memory cell.

To achieve the object, a genus of the present invention provides a method for fabricating a capacitive element of a semiconductor memory device, the method comprising the steps of forming a field insulation film in a device isolating surface region of a p-type silicon substrate, forming a gate insulation film in a device building surface region of the p-type silicon substrate, forming a gate electrode as part of a wordline on the gate insulation film, forming a pair of n-type diffusion regions as source and drain regions in the device building surface region of the p-type silicon substrate so that the n-type diffusion regions self-align to the field insulation film and the gate electrode, forming an interlayer insulation film over an entire surface, forming a node-contact hole reaching a corresponding one of the n-type diffusion regions through the interlayer insulation film, employing a first low pressure chemical-vapor deposition using a monosilane (SiH$_4$) gas for forming a non-doped polycrystalline silicon film covering the interlayer insulation film, filling the node-contact hole, introducing an n-type dopant for converting the non-doped polycrystalline silicon film into a first n-type polycrystalline silicon film, employing a second low pressure chemical-vapor deposition using a disilane (Si$_2$H$_6$) gas and a phosphine (PH$_3$) gas for forming an n-type doped amorphous silicon film covering the first n-type polycrystalline silicon film, patterning the n-type doped amorphous silicon film and the first n-type polycrystalline silicon film, removing natural oxidation surface scales from the n-type doped amorphous silicon film and the first n-type polycrystalline silicon film, employing a heat treatment under a vacuum pressure for crystallizing the n-type doped amorphous silicon film from a surface thereof converting the same into a second n-type polycrystalline silicon film with a rugged surface, and forming a capacitive insulation film over the second n-type polycrystalline silicon film to constitute a cell plate electrode.

Moreover, to achieve the object described, another genus of the present invention provides a method for fabricating a capacitive element of a semiconductor memory device, the method comprising the steps of forming a field insulation film in a device isolating surface region of a p-type silicon substrate, forming a gate insulation film in a device building surface region of the p-type silicon substrate, forming a gate electrode as part of a wordline on the gate insulation film, forming a pair of n-type diffusion regions as source and drain regions in the device building surface region of the p-type silicon substrate so that the n-type diffusion regions self-align to the field insulation film and the gate electrode, forming an interlayer insulation film over an entire surface, forming a node-contact hole reaching a corresponding one of the n-type diffusion regions through the interlayer insulation film, employing a first low pressure chemical-vapor deposition using a monosilane (SiH$_4$) gas and a phosphine (PH$_3$) gas for forming a first n-type doped amorphous silicon film on the interlayer insulation film, covering a side wall and a bottom surface of the node-contact hole, employing a second low pressure chemical-vapor deposition using a monosilane (SiH$_4$) gas for converting the first n-type doped amorphous silicon film into a first n-type polycrystalline silicon film and for forming a non-doped polycrystalline silicon film covering the first n-type polycrystalline silicon film, filling the node-contact hole, introducing an n-type dopant for converting the non-doped polycrystalline silicon film into a second n-type polycrystalline silicon film, employing a third low pressure chemical-vapor deposition using a disilane (Si$_2$H$_6$) gas and a phosphine (PH$_3$) gas for forming a second n-type doped amorphous silicon film covering the second n-type polycrystalline silicon film, patterning the second n-type doped amorphous silicon film, the second n-type polycrystalline silicon film and the first n-type polycrystalline silicon film, removing natural oxidation surface scales from the second n-type doped amorphous silicon film, the second n-type polycrystalline silicon film and the first n-type polycrystalline silicon film, employing a heat treatment under a vacuum pressure for crystallizing the second n-type doped amorphous silicon film from a surface thereof, converting the same into a third n-type polycrystalline silicon film with a rugged surface, and forming a capacitive insulation film over the third n-type polycrystalline silicon film to constitute a cell plate electrode.

Further, to achieve the object described, another genus of the present invention provides a method for fabricating a capacitive element of a semiconductor memory device, the method comprising the steps of forming a field insulation film in a device isolating surface region of a p-type silicon substrate, forming a gate insulation film in a device building surface region of the p-type silicon substrate forming a gate electrode as part of a wordline on the gate insulation film, forming a pair of n-type diffusion regions as source and drain regions in the device building surface region of the p-type silicon substrate so that the n-type diffusion regions self-align to the field insulation film and the gate electrode, forming an interlayer insulation film over an entire surface, forming a node-contact hole reaching a corresponding one of the n-type diffusion regions through the interlayer insulation film, employing a first low pressure chemical-vapor deposition using a monosilane ($SiH_4$) gas and a phosphine ($PH_3$) gas for forming a first n-type doped amorphous silicon film on the interlayer insulation film, covering a side wall and a bottom surface of the node-contact hole, employing a second low pressure chemical-vapor deposition using a disilane ($Si_2H_6$) gas and a phosphine ($PH_3$) gas for forming a second n-type doped amorphous silicon film covering the first n-type polycrystalline silicon film, filling the node-contact hole, patterning the second n-type doped amorphous silicon film and the first n-type polycrystalline silicon film, removing natural oxidation surface scales from the second n-type doped amorphous silicon film and the first n-type doped amorphous silicon film, employing a heat treatment under a vacuum pressure for crystallizing the second n-type doped amorphous silicon film and the first n-type doped amorphous silicon film from surfaces thereof converting the same into a second n-type polycrystalline silicon film and a first n-type polycrystalline silicon film, respectively, with rugged surfaces, and forming a capacitive insulation film over the second n-type polycrystalline silicon film and the first n-type polycrystalline silicon film to constitute a cell plate electrode.

BRIEF DESCRIPTION OF THE DRAWINGS

The objects, features and advantages of the present invention will become more apparent from the consideration of the following detailed description, taken in conjunction with the accompanying drawings, in which.

DESCRIPTION OF THE PREFERRED EMBODIMENTS

Figure 1A:
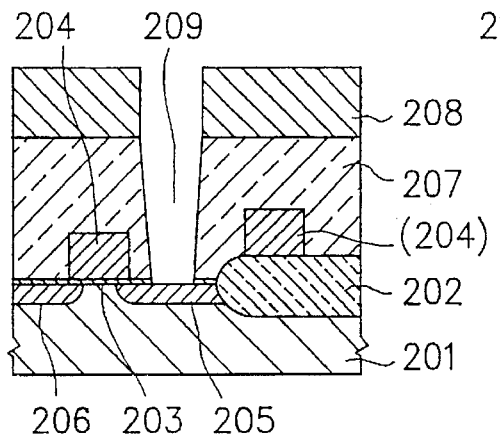
FIGS. 1A to 1F illustrate a series of schematic sections of a capacitive element of a DRAM, as it is fabricated by steps according to a conventional fabrication method.
Figure 1D:
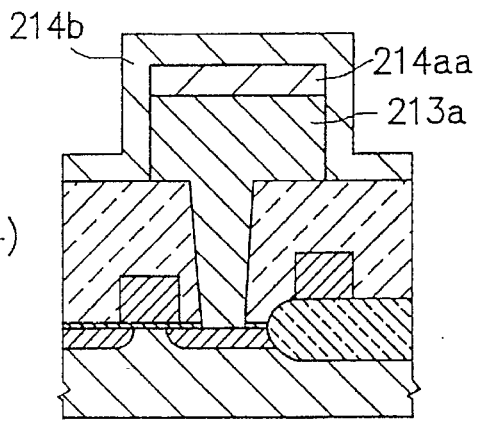
Figure 1B:
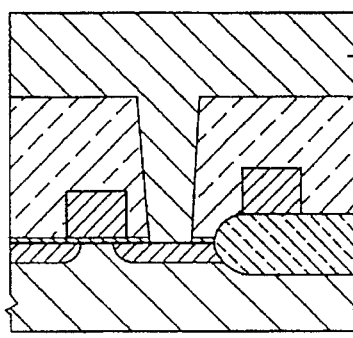

The preferred embodiments of the present invention will be described with reference to the accompanying drawings. Like or corresponding members are designated by like reference characters or corresponding reference characters in which first and second figures of a numeric part are coincident.

Figure 3A:
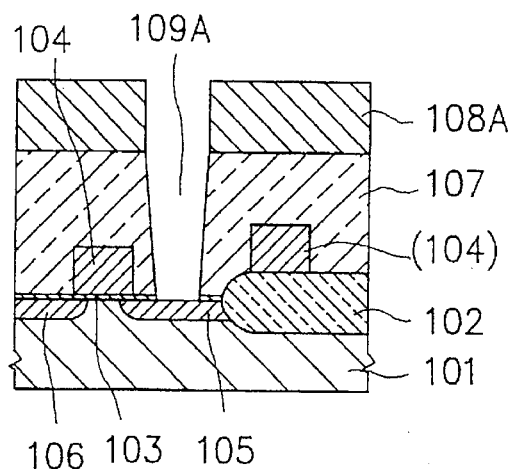
FIGS. 3A to 3E illustrate a series of schematic sections of a capacitive element of a DRAM, as it is fabricated by steps according to a first embodiment of the invention.
Figure 3B:
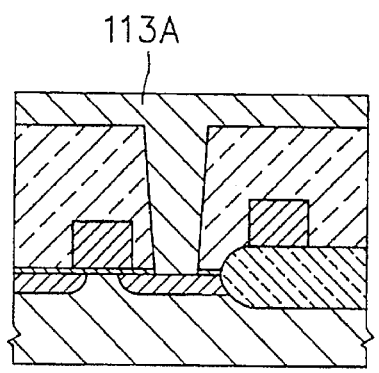
Figure 3C:
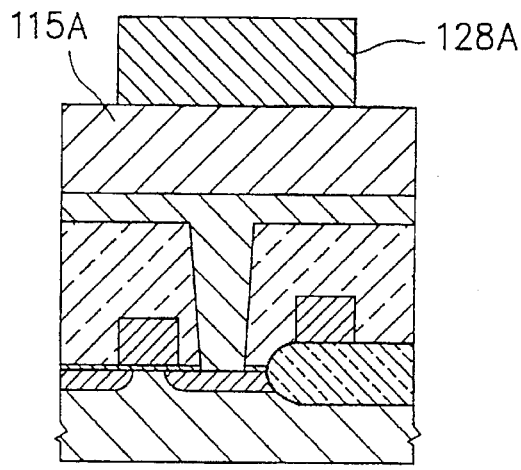
Figure 3D:
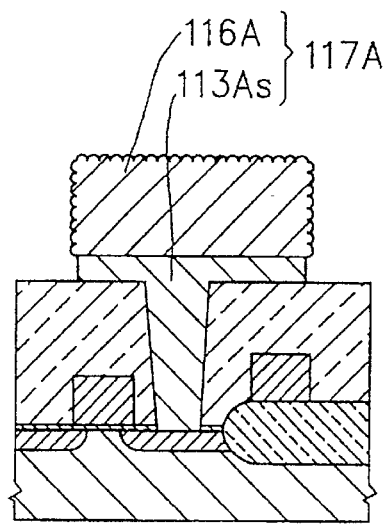
Figure 3E:
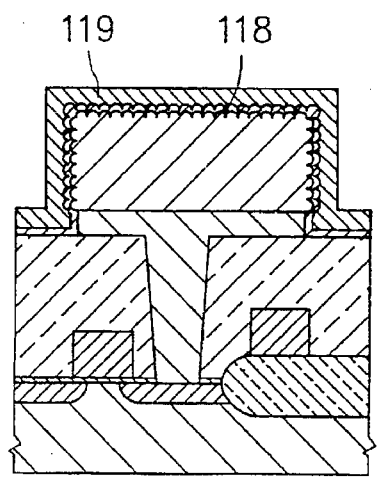
Figure 4:
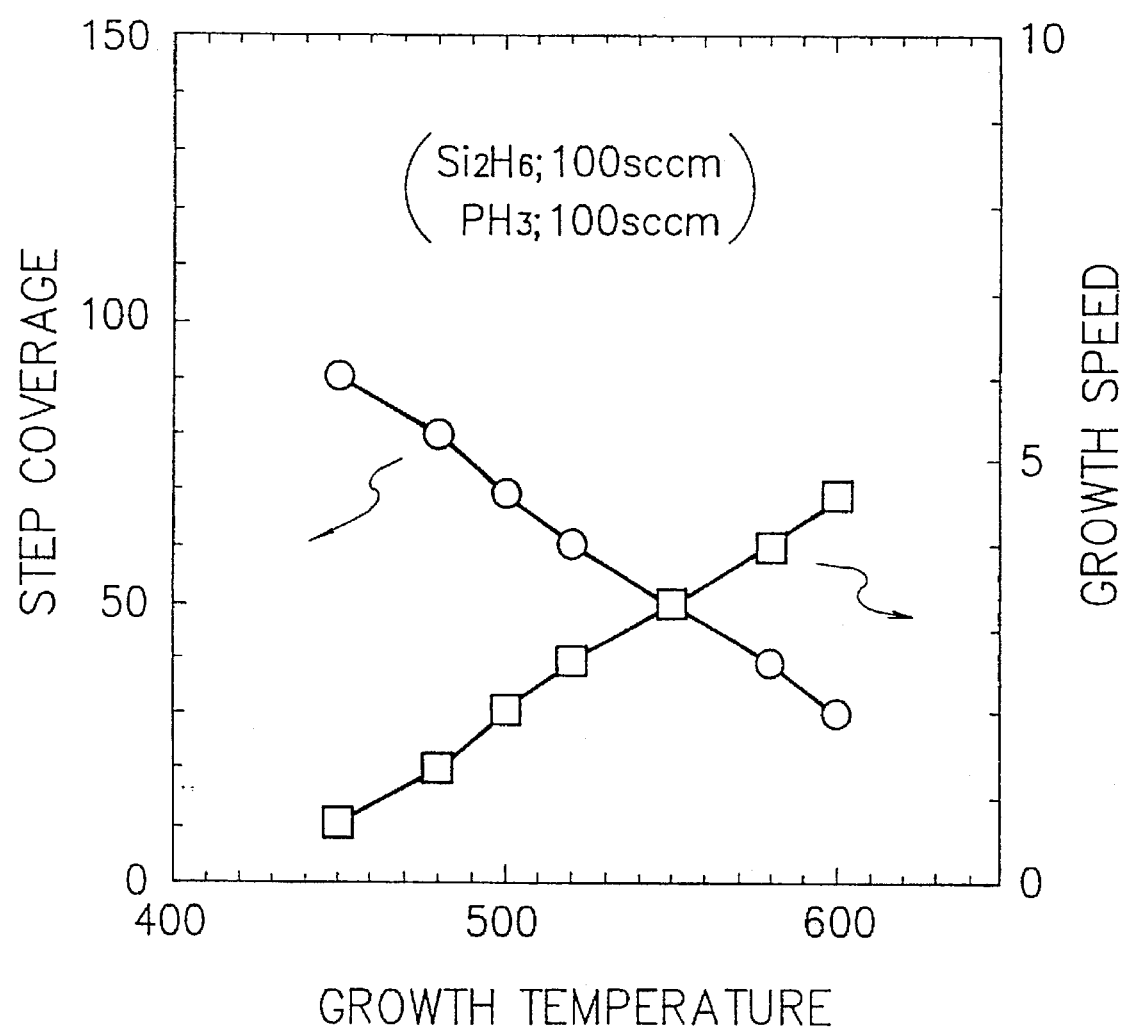
FIG. 4 is a graph describing effects of the first embodiment of the invention, showing relationships by which a step coverage and a growth speed of an n-type doped amorphous silicon film depend on a growth temperature.

FIGS. 3A to 3E show a fabrication process of a capacitive element of DRAM according to the first embodiment of the invention, and FIG. 4 illustrates a growth temperature dependency of a step coverage and a growth speed of an n-type doped amorphous silicon film according to the first embodiment.

In this embodiment, the capacitive element is fabricated according to a 0.35 μm design rule, as follows.

At a step illustrated by FIG. 3A, a LOCOS type field oxide film 102 as a field insulation film is deposited in a device isolating surface region of a p-type silicon substrate 101.

A gate oxide film 103 having a film thickness of approx. 10 nm by thermal oxidation as a gate insulation film is formed in a device building surface region of the p-type silicon substrate 101.

Gate electrodes 104 functioning as a wordline as well are deposited on the surface of the p-type silicon substrate 101.

In this case, a gate length and a gate width of the gate electrodes 104 are approx. 0.5 μm, and the minimum interval between the gate electrodes 104 and the interval between the gate electrodes 104 and the field oxide film 102 are approx. 0.5 μm.

A pair of n-type diffusion regions 105 and 106 to be source-drain regions are formed in the device building surface region of the p-type silicon substrate 101 by an ion injection of arsenic of approx. $2 \times 10^{13}$ $cm^{-2}$ or the like, self-aligning to the gate electrode 104 and the field oxide film 102. The depth of the junction between the n-type diffusion regions 105 and 106 is approx. 0.15 μm.

Then, a first interlayer insulation film having a surface flatted by a reflow or a chemical machinery polishing (CMP) or the like and a film thickness of approx. 0.5 μm, which consists of an oxidized silicon film (HTO film) prepared by a high-temperature CVD (chemical vapor deposition) method, a BPSG film or the like, is deposited.

A bit contact hole reaching the n-type diffusion region 106 is formed in the first interlayer insulation film. A bitline consisting of tungsten silicide film having a film thickness of approx. 0.2 μm and a line width of approx. 0.8 μm is formed.

Further, a second interlayer insulation film having a flat surface and a film thickness of approx. 0.5 μm, which consists of a BPSG film or the like is deposited.

As a result, an interlayer insulation film 107 having a film thickness of approx. 1 μm, consisting of a multilayer oxidized silicon insulation film is deposited over the entire surface.

In this embodiment, a memory cell of a DRAM his a COB structure in which the capacitive element is positioned higher than the bitline.

By an anisotropic etching using a photoresist film 108A as a mask, a node-contact hole 109A reaching one of the source-drain regions, that is, the n-type diffusion region 105 is formed in the interlayer insulation film 107.

This anisotropic etching is a reactive ion etching (RIE) using argon (Ar) gas as a carrier gas, and trifluoromethane ($CHF_3$) gas and tetrafluoromethane ($CF_4$) gas as an etching gas under vacuum of 40 Pa by a power of 850 W.

A flow rate ratio among these gases is, for example, $CHF_3$: $CF_4$: Ar=30 sccm: 10 sccm: 450 sccm.

The 0.35 μm design rule is also applied when the node-contact hole 109A is prepared and the diameter of the node-contact hole 109A is approx. 0.3 μm at the top end and approx. 0.2 μm at the bottom end.

That is, the node-contact hole 109A has a side wall which is nor perpendicular to the surface of the p-type silicon substrate 101 but somewhat tapered.

At a step illustrated by FIG. 3B, after the photoresist film 108 is removed, a non-doped polycrystalline silicon film (not shown) is deposited on the surface by a (first) low pressure chemical-vapor deposition (LPCVD) method using monosilane ($SiH_4$) gas as a raw gas at approx. 600° C.

The growth speed of this non-doped polycrystalline silicon film is approx. 10 nm/min.

The formation of this non-doped polycrystalline silicon film is the LPCVD method with good step coverage, and this non-doped polycrystalline silicon film has a film thickness of at least half the diameter of a node-contact hole 109A.

Further, this node-contact hole 109A has the tapered side wall. Hence, this node-contact hole 109A is sufficiently filled with this non-doped polycrystalline silicon film, and thereby voids are not found in the node-contact hole 109A.

By thermal diffusion of phosphorus at approx. 850° C., the non-doped polycrystalline silicon film is converted into a (first) n-type polycrystalline silicon film 113A.

The dopant concentration (on the surface) of this n-type polycrystalline silicon film 113A is the level of $10^{20}$ cm$^{-3}$ and a sheet resistance is approx. 60 Ω/□.

At a step illustrated by FIG. 3C, by the (second) LPCVD method using disilane ($Si_2H_6$) gas and phosphine ($PH_3$) gas as a raw gas, an n-type doped amorphous silicon film 115A having a film thickness of approx. 500 nm is deposited on the surface of the n-type polycrystalline silicon film 113A.

The dopant concentration of the n-type doped amorphous silicon film 115A is approx. 2 to $3\times10^{20}$ cm$^{-3}$. The flow rate ratio of these gases is $Si_2H_6$: $PH_3$=100 sccm: 100 sccm. The growth temperature of the n-type doped amorphous silicon film 115A is preferably in a range of 480° to 580° C.

When this growth temperature is near 600° C., the n-type polycrystalline silicon film will grow, and, even when a heat treatment under super vacuum is applied in a later step, a rugged surface cannot be obtained.

Further, when the growth temperature is approx. 450° C., the advantage of a high growth speed due to the use of the aforementioned raw gas cannot be enjoyed.

In addition, in the growth method of the n-type doped amorphous silicon film using the foregoing raw gas, although the step coverage is not so good, the surface of the n-type polycrystalline silicon film 113A constituting the ground of the n-type doped amorphous silicon film 115A is generally flat and thus no trouble occurs in the deposition of the n-type doped amorphous silicon film 115A.

Next, a photoresist film 128A covering a predetermined area for a storagenode electrode formation is deposited on the surface of the n-type doped amorphous silicon film 115A.

At a step illustrated by FIG. 3D, by the anisotropic etching using the photoresist film 128A as the mask, an n-type doped amorphous silicon film (not shown) and an n-type polycrystalline silicon film 113Aa are left in only the predetermined area for the storagenode electrode formation.

After eliminating the photoresist film 128A, by a mixing solution of ammonia ($NH_4OH$) and hydrogen peroxide ($H_2O_2$), the exposed surfaces of the n-type doped amorphous silicon film and the n-type polycrystalline silicon film 113Aa are washed and a natural oxidation film is removed from the above exposed surfaces using hydrofluoric acid (HF).

Next, a heat treatment for approx. one hour is applied under super vacuum of approx. $1.3\times10^{-7}$ Pa at approx. 600° C.

Thus, the remaining n-type doped amorphous silicon film is crystallized from its surface, thereby converting the n-type doped amorphous silicon film into an (second) n-type polycrystalline silicon film 116A having grains of semispherical ruggedness on its surface.

In this embodiment, hence, the formation of the storagenode electrode 117A composed of the n-type polycrystalline silicon films 113Aa and 116A is finished.

In this embodiment, a contact resistance (Rc) per one node-contact hole 109A is approx. equal, for example, a level of $10^3$ Ω/each, to that of the case to which the 0.35 μm design rule is applied in the fabrication method disclosed in the JPA 5-67730.

Figure 1E:
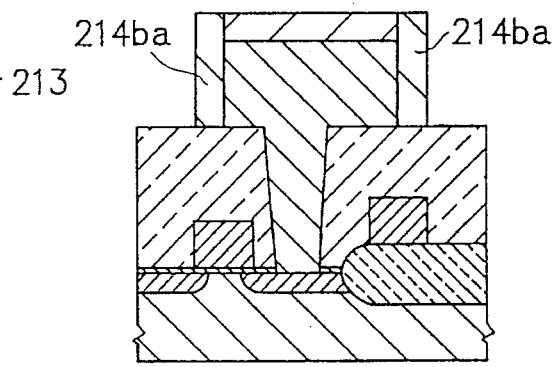
Figure 1C:
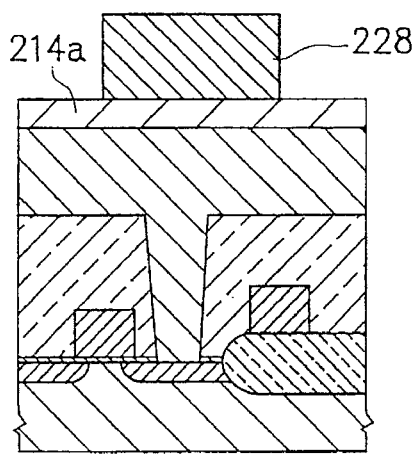
Figure 1F:
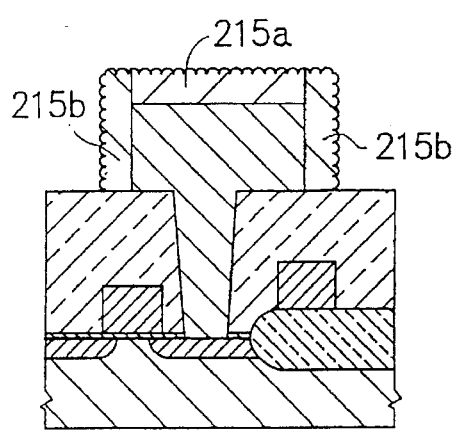
Figure 2A:
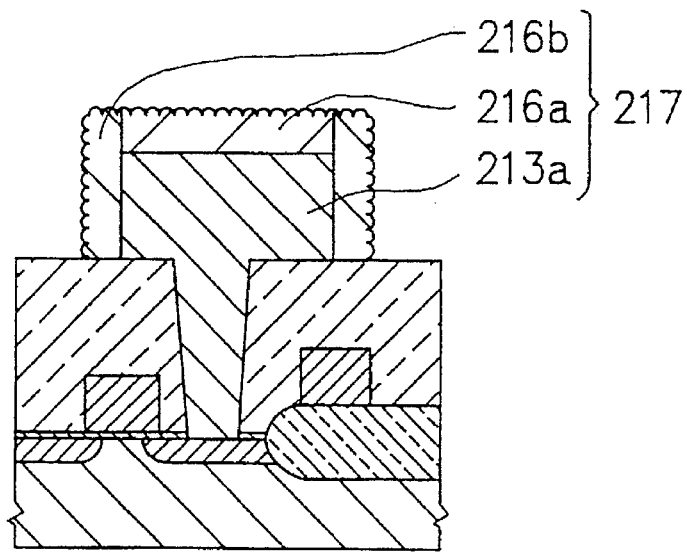
FIGS. 2A and 2B illustrate schematic sections of the capacitive element, as it is fabricated by additional steps according to the conventional fabrication method.
Figure 2B:
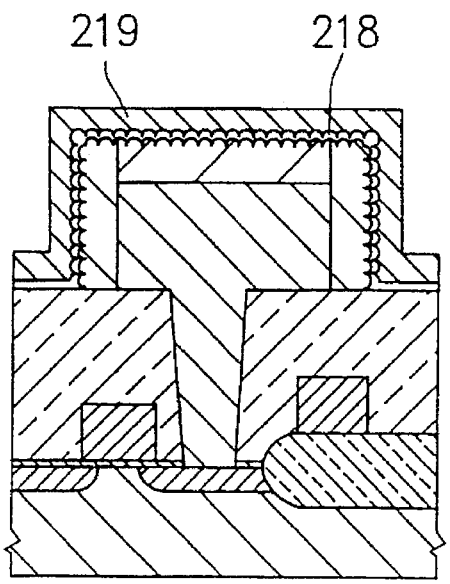

At a step illustrated by FIG. 1E, a rapid thermal nitriding (RTN) is executed at approx. 870° C. in an ammonia ($NH_3$) gas atmosphere to prepare a silicon nitride film (not shown) having a film thickness of approx. 0.5 nm on the surfaces of the n-type polycrystalline silicon films 113Aa and 116A.

After a silicon nitride film (not shown) having a film thickness of approx. 6 nm is formed over the entire surface by the LPCVD method, the object is exposed to a steam atmosphere at approx. 850° C. for approx. 30 minutes to form silicon dioxide film (not shown) on the surface of the silicon nitride film by thermal oxidation, resulting in preparing a capacitive insulation film 118 having a film thickness of approx. 50 nm in silicon dioxide film equivalent.

Then, under nearly the same condition as that for depositing the n-type polycrystalline silicon film 113A, an n-type polycrystalline silicon film having a film thickness of approx. 150 to 200 nm is deposited to prepare a cell plate electrode 119 over the surface, with the result of the finish of the formation of the capacitive element in this embodiment.

In this embodiment, as described above, the growth of the silicon film for preparing the storagenode electrode 117A can be performed by applying the LPCVD method two times.

Hence, compared with the fabrication method disclosed in the JPA 5-67730, the capacitive element can be fabricated in a simpler process.

Further, in this embodiment, a step of converting a non-doped amorphous silicon film into an n-type polycrystalline silicon film is not employed, and a practical drop of a capacity due to expansion of a depletion layer to the surface of the storagenode electrode can be avoided.

Furthermore, in this embodiment, an etch back step of the silicon films is not required, and hence the dispersion of the capacity of the capacitive element can be readily avoided.

Figure 5A:
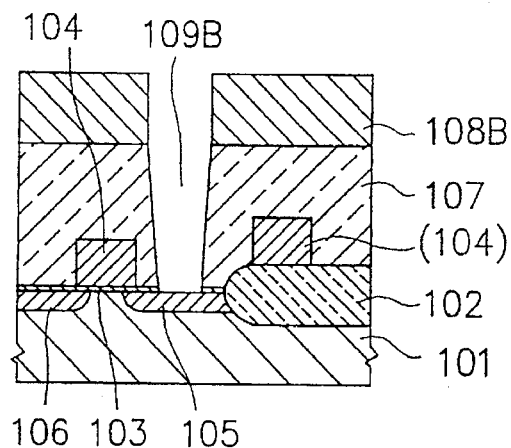
FIGS. 5A to 5E illustrate a series of schematic sections of a capacitive element of a DRAM, as it is fabricated by steps according to a second embodiment of the invention.
Figure 5B:
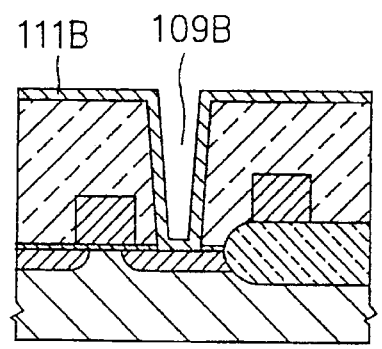
Figure 5C:
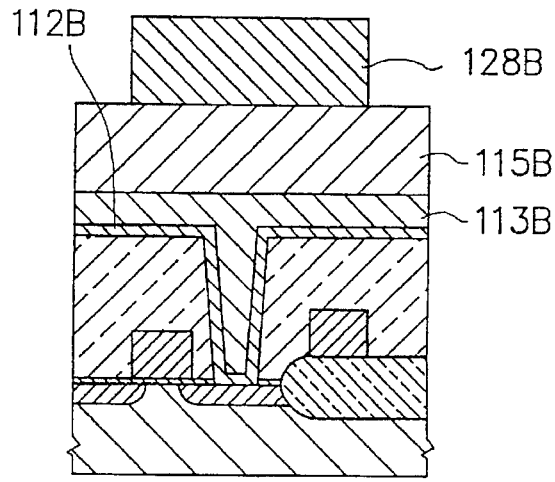
Figure 5D:
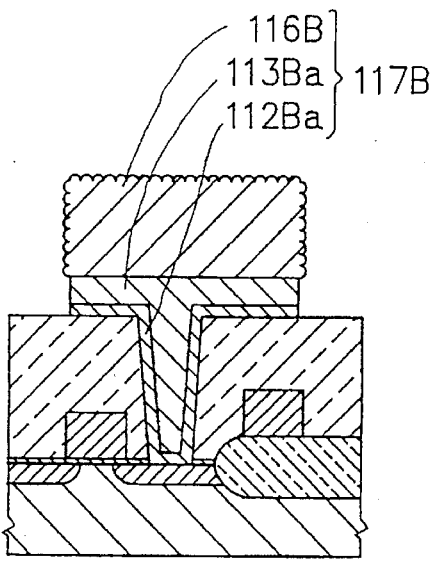
Figure 5E:
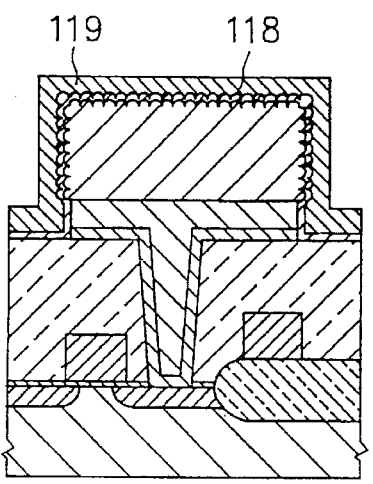
Figure 6:
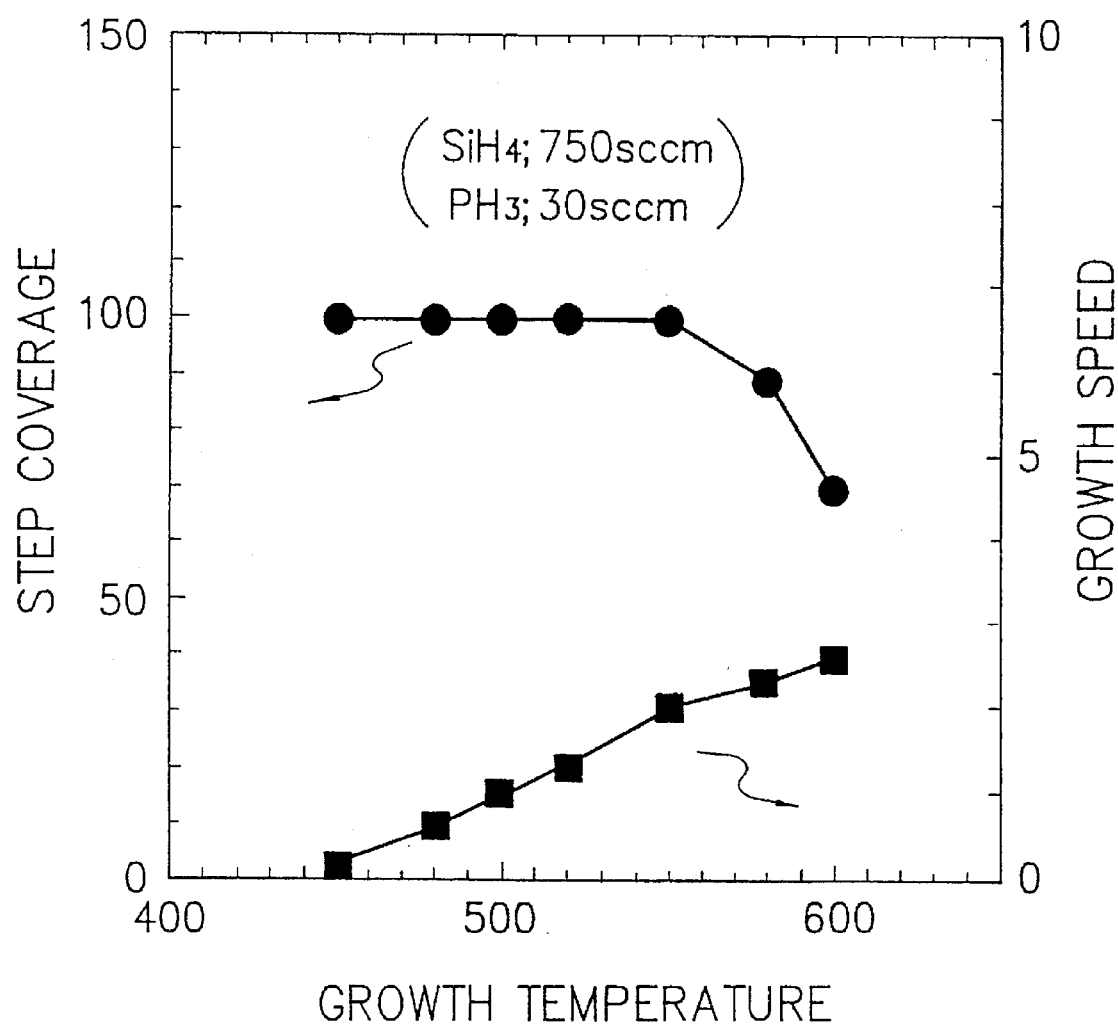
FIG. 6 is a graph describing effects of the second embodiment of the invention, showing relationships by which a step coverage and a growth speed of an n-type doped amorphous silicon film depend on a growth temperature.

FIGS. 5A to 5E show a fabrication process of a capacitive element of a DRAM according to the second embodiment of the invention, and FIG. 6 illustrates a growth temperature dependency of a step coverage and a growth speed of an n-type doped amorphous silicon film according to the second embodiment.

In this embodiment, the capacitive element is fabricated according to the 0.35 μm design rule, as follows.

At a step illustrated by FIG. 5A, in the same manner as the first embodiment, a field oxide film 102 and a gate oxide film 103 are formed in a device isolating region and a device building surface region of a p-type silicon substrate 101 and gate electrodes 104 are formed on the surface of the p-type silicon substrate 101.

After n-type diffusion regions 105 and 106 are formed, self-aligning to the gate electrodes 104 and the field oxide film 102, an interlayer insulation film 107 is deposited on the surface.

By an anisotropic etching using a photoresist film 108B as a mask, a node-contact hole 109B reaching the n-type diffusion region 105 is formed.

This node-contact hole 109B also has a tapered side wall with respect to the p-type silicon substrate 101.

At a step illustrated by FIG. 5B, after the photoresist film 108B is removed, the (first) non-doped amorphous silicon film 111B having a film thickness of approx. 50 nm is deposited on the surface of the interlayer insulation film 107 and the side wall and the bottom of the node-contact hole 109B by a (first) LPCVD method using monosilane ($SiH_4$) gas and phosphine ($PH_3$) gas as a raw gas.

A dopant concentration of the n-type doped amorphous silicon film 111B is approx. 2 to $3 \times 10^{20}$ $cm^{-3}$. The flow rate ratio of these gases is $SiH_4$: $PH_3$=750 sccm: 30 sccm.

The growth temperature of the n-type doped amorphous silicon film 111B is preferably in a range of 480° to 550° C.

When this growth temperature is higher than 560° C., the advantage of the good step coverage by using the above raw gas cannot be enjoyed.

Further, when the growth temperature is approx. 450° C., the growth speed becomes too slow and thus the growth time too long.

Moreover, a silicon single crystal layer grows on the bottom of the node-contact hole 109B.

At a step illustrated by FIG. 5C, by the (second) LPCVD method using monosilane ($SiH_4$) gas as a raw gas at approx. 600° C., a non-doped polycrystalline silicon film (not shown) having a film thickness of approx. 200 nm is deposited to cover the n-type doped amorphous silicon film 111B.

Hence, with this non-doped polycrystalline silicon film, the node-contact hole 109B is sufficiently filled.

By thermal diffusion of phosphorus at approx. 850° C., the non-doped polycrystalline silicon film is converted into a (second) n-type polycrystalline silicon film 113B.

Concurrently, the n-type doped amorphous silicon film 111B is also converted into the (first) n-type polycrystalline silicon film 112B.

The dopant concentration (on the surface) of this n-type polycrystalline silicon film 113B is the level of $10^{20}$ $cm^{-3}$ and a sheet resistance is approx. 60 $\Omega/\square$.

Next, in the same manner as the first embodiment, by the (third) LPCVD method using disilane ($Si_2H_6$) gas and phosphine ($PH_3$) gas as a raw gas, an n-type doped amorphous silicon film 115B having a film thickness of approx. 500 nm is deposited on the surface of the n-type polycrystalline silicon film 113B.

A photoresist film 128B covering the predetermined area for a storagenode electrode formation is deposited on the surface of the n-type doped amorphous silicon film 115B.

At a step illustrated by FIG. 5D, by the anisotropic etching using the photoresist film 128B as the mask, an n-type doped amorphous silicon film (not shown) and n-type polycrystalline silicon films 113Ba and 112Ba are left in only the predetermined area for the storagenode electrode formation.

After eliminating the photoresist film 128B, by a mixing solution of ammonia ($NH_4OH$) and hydrogen peroxide ($H_2O_2$), the exposed surfaces of the n-type doped amorphous silicon film and the n-type polycrystalline silicon films 113Ba and 112Ba are washed and a natural oxidation film is removed from the above exposed surfaces using hydrofluoric acid (HF).

Next, in the same manner as the first embodiment, a heat treatment for approx. one hour is applied under super vacuum of approx. $1.3 \times 10^{-7}$ Pa at approx. 600° C.

Thus, the remaining n-type doped amorphous silicon film is crystallized from its surface, thereby converting the n-type doped amorphous silicon film into an (third) n-type polycrystalline silicon film 116B having grains of semispherical ruggedness on its surface.

In this way, the formation of the storagenode electrode 117B composed of the n-type polycrystalline silicon films 112Ba, 113Ba and 116B is finished.

In this embodiment, a contact resistance (Rc) per one node-contact hole 109B is lower, for example, a level of $10_2^2$ $\Omega$/each, than that of the first embodiment (and the case to which the 0.35 μm design rule is applied in the fabrication method disclosed in the JPA 5-67730).

The reason of this result is as follows.

That is, in the first embodiment, the dopant concentration at the bottom of the node-contact hole 108A of the n-type polycrystalline silicon film 113A is lower (cannot increase) than that at the surface of the n-type polycrystalline silicon film 113A.

On the contrary, in this embodiment, the dopant concentration of the n-type doped amorphous silicon film 111B (n-type polycrystalline silicon film 112Ba) at the bottom of the node-contact hole 108B can be increased because of the n-type doped amorphous silicon film.

At a step illustrated by FIG. 5E, in the same manner as the first embodiment, a capacitive insulation film 118 having a film thickness of approx. 50 nm in silicon dioxide film equivalent is deposited, and an n-type polycrystalline silicon film having a film thickness of approx. 150 to 200 nm is deposited to prepare a cell plate electrode 119 over the surface, resulting in finish of the formation of the capacitive element in this embodiment.

In this embodiment, the effects of the first embodiment can be obtained except a longer fabrication process than that of the first embodiment.

Although the fabrication process is longer than that of the first embodiment, the capacitive element can be fabricated in a simpler process than that disclosed in the JPA 5-67730.

Further, as described above, the contact resistance Rc of the node-contact hole 109B is lower than that of the node-contact hole 109A of the first embodiment, and writing and reading speeds of the capacitive element are quicker than those of the first embodiment.

FIGS. 7A to 7E show a fabrication process of a capacitive element of a DRAM according to the third embodiment of the invention.

In this embodiment, the capacitive element is fabricated according to the 0.35 μm design rule, as follows.

Figure 7A:
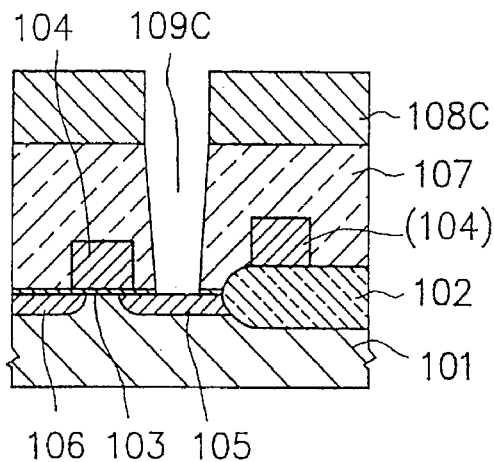
FIGS. 7A to 7E illustrate a series of schematic sections of a capacitive element of a DRAM, as it is fabricated by steps according to a third embodiment of the invention.

At a step illustrated by FIG. 7A, in the same manner as the first embodiment, a field oxide film 102 and a gate oxide film 103 are formed in a device isolating region and a device building surface region of a p-type silicon substrate 101 and gate electrodes 104 are formed on the surface of the p-type silicon substrate 101.

After n-type diffusion regions 105 and 106 are formed, self-aligning to the gate electrodes 104 and the field oxide film 102, an interlayer insulation film 107 is deposited on the surface.

By an anisotropic etching using a photoresist film 108C as a mask, a node-contact hole 109C reaching the n-type diffusion region 105 is formed.

This node-contact hole 109C also has a tapered side wall with respect to the p-type silicon substrate 101.

Figure 7B:
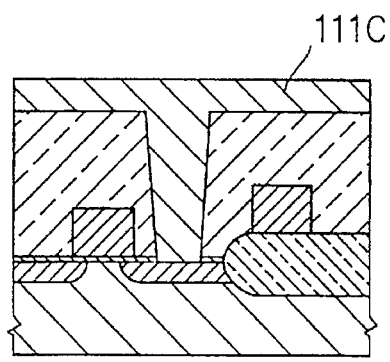

At a step illustrated by FIG. 7B, after the photoresist film 108C is removed in the same manner as the aforementioned second embodiment, the (first) non-doped amorphous silicon film 111C having a film thickness of approx. 200 nm is deposited so as to fill up the node-contact hole 109C by the (first) LPCVD method using monosilane ($SiH_4$) gas and phosphine ($PH_3$) gas as a raw gas.

The dopant concentration of the n-type doped amorphous silicon film 111C is also approx. 2 to $3 \times 10^{20}$ $cm^{-3}$.

Figure 7C:
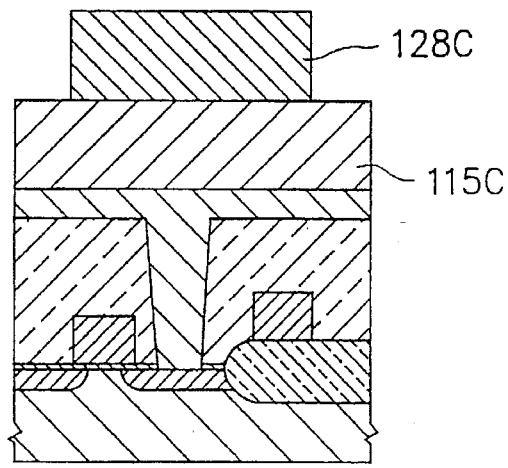

At a step illustrated by FIG. 7C, in the same manner as the first embodiment, by the (second) LPCVD method using disilane ($Si_2H_6$) gas and phosphine ($PH_3$) gas as a raw gas, an (second) n-type doped amorphous silicon film 115C having a film thickness of approx. 500 nm is deposited to cover the surface of the n-type doped amorphous silicon film 111C.

A photoresist film 128C covering the predetermined area for a storagenode electrode formation is deposited on the surface of the n-type doped amorphous silicon film 115C.

Figure 7D:
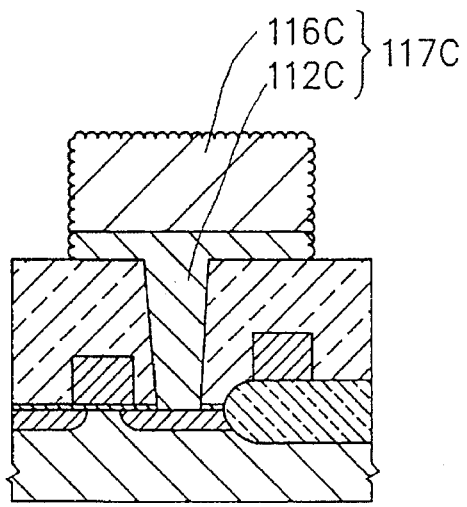

At a step illustrated by FIG. 7D, by the anisotropic etching using the photoresist film 128C as the mask, first and second n-type doped amorphous silicon films (not shown) are left in only the predetermined area for the storagenode electrode formation.

After eliminating the photoresist film 128C, by a mixing solution of ammonia ($NH_4OH$) and hydrogen peroxide ($H_2O_2$), the exposed surfaces of the first and second n-type doped amorphous silicon films are washed and a natural oxidation film is removed from the above exposed surfaces using hydrofluoric acid (HF).

Next, in the same manner as the first embodiment, a heat treatment for approx. one hour is applied under super vacuum of approx. $1.3 \times 10^{-7}$ Pa at approx. 600° C.

Thus, the remaining first and second n-type doped amorphous silicon films are crystallized from their surfaces, thereby converting the first and second n-type doped amorphous silicon films into an (first) n-type polycrystalline silicon film 112C and a (second) n-type polycrystalline silicon film 116C with grains of semispherical ruggedness on their surfaces.

In this way, the formation of the storagenode electrode 117C composed of the n-type polycrystalline silicon films 112C and 116C is finished.

Figure 7E:
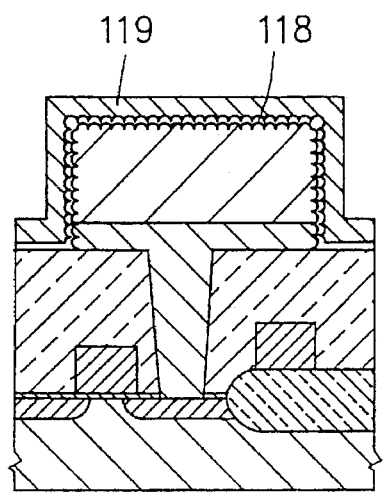

At a step illustrated by FIG. 7E, in the same manner as the first embodiment, a capacitive insulation film 118 having a film thickness of approx. 50 nm in silicon dioxide film equivalent is deposited, and an n-type polycrystalline silicon film having a film thickness of approx. 150 to 200 nm is deposited to prepare a cell plate electrode 119 over the surface, resulting in finish of the formation of the capacitive element in this embodiment.

In this embodiment, the same effects as those of the first and second embodiments can be obtained.

Further, a contact resistance Rc of the node-contact hole can be reduced by a simpler fabrication process than that of the second embodiment.

As described above, in a fabrication method of a capacitive element of semiconductor memory device of the invention, dispersion of capacity of the capacitive element is small and a simple fabrication process suitable for miniaturization of a cell size can be achieved.

While the present invention has been described with reference to the particular illustrative embodiments, it is not to be restricted by those embodiments but only by the appended claims. It is to be appreciated that those skilled in the art can change or modify the embodiments without departing from the scope and spirit of the invention.

What is claimed:

1. A method for fabricating a capacitive element of a semiconductor memory device, the method comprising the steps of:

forming a field insulation film in a device isolating surface region of a p-type silicon substrate;

forming a gate insulation film in a device building surface region of the p-type silicon substrate;

forming a gate electrode as part of a wordline on the gate insulation film;

forming a pair of n-type diffusion regions as source and drain regions in the device building surface region of the p-type silicon substrate so that the n-type diffusion regions self-align to the field insulation film and the gate electrode;

forming an interlayer insulation film over an entire surface;

forming a node-contact hole reaching a corresponding one of the n-type diffusion regions through the interlayer insulation film;

providing a first low pressure chemical-vapor deposition using a monosilane ($SiH_4$) gas for forming a non-doped polycrystalline silicon film covering the interlayer insulation film, filling the node-contact hole;

introducing an n-type dopant for converting the non-doped polycrystalline silicon film into a first n-type polycrystalline silicon film;

providing a second low pressure chemical-vapor deposition using a disilane ($Si_2H_6$) gas and a phosphine ($PH_3$) gas for forming an n-type doped amorphous silicon film covering the first n-type polycrystalline silicon film;

patterning the n-type doped amorphous silicon film and the first n-type polycrystalline silicon film;

removing natural oxidation surface scales from the n-type doped amorphous silicon film and the first n-type polycrystalline silicon film;

providing a heat treatment under a vacuum pressure for crystallizing the n-type doped amorphous silicon film from a surface thereof, converting the same into a second n-type polycrystalline silicon film with a rugged surface; and forming a capacitive insulation film over the second n-type polycrystalline silicon film to constitute a cell plate electrode.

2. A method for fabricating a capacitive element of a semiconductor memory device, the method comprising the steps of:

forming a field insulation film in a device isolating surface region of a p-type silicon substrate;

forming a gate insulation film in a device building surface region of the p-type silicon substrate;

forming a gate electrode as part of a wordline on the gate insulation film;

forming a pair of n-type diffusion regions as source and drain regions in the device building surface region of the p-type silicon substrate so that the n-type diffusion regions self-align to the field insulation film and the gate electrode;

forming an interlayer insulation film over an entire surface;

forming a node-contact hole reaching a corresponding one of the n-type diffusion regions through the interlayer insulation film;

providing a first low pressure chemical-vapor deposition using a monosilane ($SiH_4$) gas and a phosphine ($PH_3$) gas for forming a first n-type doped amorphous silicon film on the interlayer insulation film, covering a side wall and a bottom surface of the node-contact hole;

employing a second low pressure chemical-vapor deposition using a monosilane ($SiH_4$) gas for converting the first n-type doped amorphous silicon film into a first n-type polycrystalline silicon film and for forming a non-doped polycrystalline silicon film covering the first n-type polycrystalline silicon film, filling the node-contact hole;

introducing an n-type dopant for converting the non-doped polycrystalline silicon film into a second n-type polycrystalline silicon film;

providing a third low pressure chemical-vapor deposition using a disilane ($Si_2H_6$) gas and a phosphine ($PH_3$) gas for forming a second n-type doped amorphous silicon film covering the second n-type polycrystalline silicon film;

patterning the second n-type doped amorphous silicon film, the second n-type polycrystalline silicon film and the first n-type polycrystalline silicon film;

removing natural oxidation surface scales from the second n-type doped amorphous silicon film, the second n-type polycrystalline silicon film and the first n-type polycrystalline silicon film;

providing a heat treatment under a vacuum pressure for crystallizing the second n-type doped amorphous silicon film from a surface thereof, converting the same into a third n-type polycrystalline silicon film with a rugged surface; and providing a capacitive insulation film over the third n-type polycrystalline silicon film to constitute a cell plate electrode.

3. A method for fabricating a capacitive element of a semiconductor memory device, the method comprising the steps of:

forming a field insulation film in a device isolating surface region of a p-type silicon substrate;

forming a gate insulation film in a device building surface region of the p-type silicon substrate;

forming a gate electrode as part of a wordline on the gate insulation film;

forming a pair of n-type diffusion regions as source and drain regions in the device building surface region of the p-type silicon substrate so that the n-type diffusion regions self-align to the field insulation film and the gate electrode;

forming an interlayer insulation film over an entire surface;

forming a node-contact hole reaching a corresponding one of the n-type diffusion regions through the interlayer insulation film;

providing a first low pressure chemical-vapor deposition using a monosilane ($SiH_4$) gas and a phosphine ($PH_3$) gas for forming a first n-type doped amorphous silicon film on the interlayer insulation film, covering a side wall and a bottom surface of the node-contact hole;

providing a second low pressure chemical-vapor deposition using a disilane ($Si_2H_6$) gas and a phosphine ($PH_3$) gas for forming a second n-type doped amorphous silicon film covering a first n-type polycrystalline silicon film, filling the node-contact hole;

patterning the second n-type doped amorphous silicon film and the first n-type polycrystalline silicon film;

removing natural oxidation surface scales from the second n-type doped amorphous silicon film and the first n-type doped amorphous silicon film;

providing a heat treatment under a vacuum pressure for crystallizing the second n-type doped amorphous silicon film and the first n-type doped amorphous silicon film from surfaces thereof, converting the same into a second n-type polycrystalline silicon film and a first n-type polycrystalline silicon film, respectively, with rugged surfaces; and forming a capacitive insulation film over the second n-type polycrystalline silicon film and the first n-type polycrystalline silicon film to constitute a cell plate electrode.

* * * * *